US011990380B2

(12) United States Patent
Liman et al.

(10) Patent No.: US 11,990,380 B2
(45) Date of Patent: May 21, 2024

(54) METHODS AND SYSTEMS FOR COMBINING X-RAY METROLOGY DATA SETS TO IMPROVE PARAMETER ESTIMATION

(71) Applicant: KLA Corporation, Milpitas, CA (US)

(72) Inventors: Christopher Liman, Milpitas, CA (US); Antonio Arion Gellineau, Santa Clara, CA (US); Andrei V. Shchegrov, Campbell, CA (US); Sungchul Yoo, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 474 days.

(21) Appl. No.: 16/847,388

(22) Filed: Apr. 13, 2020

(65) Prior Publication Data

US 2020/0335406 A1   Oct. 22, 2020

Related U.S. Application Data

(60) Provisional application No. 62/836,261, filed on Apr. 19, 2019.

(51) Int. Cl.
*G01B 15/02* (2006.01)
*G01B 15/04* (2006.01)
(Continued)

(52) U.S. Cl.
CPC .............. *H01L 22/26* (2013.01); *G01B 15/02* (2013.01); *G01B 15/04* (2013.01); *G01N 23/20* (2013.01);
(Continued)

(58) Field of Classification Search
CPC .... G01B 15/02; G01B 15/04; G01B 2210/56; G01N 23/20
See application file for complete search history.

(56) References Cited

U.S. PATENT DOCUMENTS 5,608,526 A   3/1997   Piwonka-Corle et al.
5,859,424 A   1/1999   Norton et al.
(Continued)

FOREIGN PATENT DOCUMENTS

CN   110603435 A  * 12/2019  ............. G01B 15/00
JP    5700685 B2     4/2015
(Continued)

OTHER PUBLICATIONS

Gil, J.J., et al., "Serial-parallel decompositions of Mueller matrices," Josa A, vol. 30, No. 1, pp. 32-50, 2013.
(Continued)

*Primary Examiner* — Mohammad M Choudhry
(74) *Attorney, Agent, or Firm* — Spano Law Group; Joseph S. Spano

(57) ABSTRACT

Methods and systems for measuring a complex semiconductor structure based on measurement data before and after a critical process step are presented. In some embodiments, the measurement is based on x-ray scatterometry measurement data. In one aspect, a measurement is based on fitting combined measurement data to a simplified geometric model of the measured structure. In some embodiments, the combined measurement data is determined by subtraction of a measured diffraction pattern before the critical process step from a measured diffraction pattern after the critical process step. In some embodiments, the simplified geometric model includes only the features affected by the critical process step. In another aspect, a measurement is based on a combined data set and a trained signal response metrology (SRM) model. In another aspect, a measurement is based on actual measurement data after the critical process step and simulated measurement data before the critical process step.

17 Claims, 11 Drawing Sheets

(51) Int. Cl.
*G01N 23/20* (2018.01)
*H01L 21/66* (2006.01)
*H01L 21/67* (2006.01)

(52) U.S. Cl.
CPC .... *H01L 21/67253* (2013.01); *G01B 2210/56* (2013.01)

(56) References Cited

U.S. PATENT DOCUMENTS

| | | | |
|---|---|---|---|
| 6,023,338 | A | 2/2000 | Bareket |
| 6,429,943 | B1 | 8/2002 | Opsal et al. |
| 6,716,646 | B1 | 4/2004 | Wright et al. |
| 6,778,275 | B2 | 8/2004 | Bowes |
| 6,787,773 | B1 | 9/2004 | Lee |
| 6,992,764 | B1 | 1/2006 | Yang et al. |
| 7,242,477 | B2 | 7/2007 | Mieher et al. |
| 7,321,426 | B1 | 1/2008 | Poslavsky et al. |
| 7,406,153 | B2 | 7/2008 | Berman |
| 7,478,019 | B2 | 1/2009 | Zangooie et al. |
| 7,626,702 | B2 | 12/2009 | Ausschnitt et al. |
| 7,656,528 | B2 | 2/2010 | Abdulhalim et al. |
| 7,826,071 | B2 | 11/2010 | Shchegrov et al. |
| 7,842,933 | B2 | 11/2010 | Shur et al. |
| 7,873,585 | B2 | 1/2011 | Izikson |
| 7,929,667 | B1 | 4/2011 | Zhuang et al. |
| 7,933,026 | B2 | 4/2011 | Opsal et al. |
| 8,068,662 | B2 | 11/2011 | Zhang et al. |
| 8,138,498 | B2 | 3/2012 | Ghinovker |
| 9,311,431 | B2 | 4/2016 | Yoo et al. |
| 2003/0021465 | A1 | 1/2003 | Adel et al. |
| 2003/0197872 | A1* | 10/2003 | Littau ................ G01N 21/4788 356/625 |
| 2004/0156474 | A1 | 8/2004 | Yokhin et al. |
| 2006/0133570 | A1 | 6/2006 | Mazor et al. |
| 2007/0221842 | A1 | 9/2007 | Morokuma et al. |
| 2008/0316442 | A1 | 12/2008 | Adel et al. |
| 2009/0152463 | A1 | 6/2009 | Toyoda et al. |
| 2011/0266440 | A1 | 11/2011 | Boughorbel et al. |
| 2012/0292502 | A1 | 11/2012 | Langer et al. |
| 2013/0064442 | A1* | 3/2013 | Chang .................... G06T 7/001 382/149 |
| 2013/0208279 | A1 | 8/2013 | Smith |
| 2013/0304424 | A1 | 11/2013 | Bakeman et al. |
| 2014/0019097 | A1 | 1/2014 | Bakeman et al. |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0297211 | A1 | 10/2014 | Pandev et al. |
| 2015/0110249 | A1 | 4/2015 | Bakeman et al. |
| 2015/0117610 | A1 | 4/2015 | Veldman et al. |
| 2015/0204664 | A1 | 7/2015 | Bringoltz et al. |
| 2015/0300965 | A1 | 10/2015 | Sezginer et al. |
| 2016/0011523 | A1* | 1/2016 | Singh .................. G03F 7/70633 355/77 |
| 2016/0109230 | A1 | 4/2016 | Pandev et al. |
| 2016/0202193 | A1 | 7/2016 | Hench et al. |
| 2016/0320319 | A1 | 11/2016 | Hench et al. |
| 2017/0061604 | A1 | 3/2017 | Pandev |
| 2017/0167862 | A1 | 6/2017 | Dziura et al. |
| 2017/0287751 | A1* | 10/2017 | Kuznetsov .......... G03F 7/70633 |
| 2018/0106735 | A1 | 4/2018 | Gellineau et al. |
| 2019/0049861 | A1* | 2/2019 | Van Voorst ......... G03F 7/70616 |

FOREIGN PATENT DOCUMENTS

| | | |
|---|---|---|
| JP | 2018534758 A | 11/2018 |
| WO | 2016007413 A1 | 1/2016 |
| WO | 2018222613 A1 | 12/2018 |

OTHER PUBLICATIONS https://gfx.cs.princeton.edu/pubs/Barnes_2009_PAR/patchmatch.pdf.
Lemaillet, Germer, et. al., "Intercomparison between optical and x-ray scatterometry measurements of FinFET structures," Proc. SPIE, v.8681, p. 86810Q (2013).
Kline, R. Joseph, et. al., "X-Ray Scattering Critical Dimensional Metrology Using a Compact X-Ray Source for Next Generation Semiconductor Devices," J. Micro/Nanolith. MEMS MOEMS 16(1), 014001 (Jan.-Mar. 2017).
International Search Report dated Aug. 3, 2020, for PCT Application No. PCT/US2020/028386. Filed on Apr. 16, 2020 by KLA Corporation, 4 pages.

* cited by examiner

METHODS AND SYSTEMS FOR COMBINING X-RAY METROLOGY DATA SETS TO IMPROVE PARAMETER ESTIMATION

CROSS REFERENCE TO RELATED APPLICATION

The present application for patent claims priority under 35 U.S.C. § 119 from U.S. provisional patent application Ser. No. 62/836,261 entitled "Combining X-Ray Metrology Data Sets to Extract Critical Parameters More Efficiently," filed Apr. 19, 2019, the subject matter of which is incorporated herein by reference in its entirety.

TECHNICAL FIELD

The described embodiments relate to metrology systems and methods, and more particularly to methods and systems for improved measurement of parameters characterizing the dimensions of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension (SCR) measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. In addition, the increasing number of parameters required to characterize complex structures (e.g., FinFETs), leads to increasing parameter correlation. As a result, the parameters characterizing the target often cannot be reliably decoupled with available measurements.

In one example, longer wavelengths (e.g. near infrared) have been employed in an attempt to overcome penetration issues for 3D FLASH devices that utilize polysilicon as one of the alternating materials in the stack. However, the mirror like structure of 3D FLASH intrinsically causes decreasing light intensity as the illumination propagates deeper into the film stack. This causes sensitivity loss and correlation issues at depth. In this scenario, SCD is only able to successfully extract a reduced set of metrology dimensions with high sensitivity and low correlation.

In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical metrology tools have been developed. For example, tools with multiple angles of illumination, shorter illumination wavelengths, broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Atomic force microscopes (AFM) and scanning-tunneling microscopes (STM) are able to achieve atomic resolution, but they can only probe the surface of the specimen. In addition, AFM and STM microscopes require long scanning times. Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance. X-ray reflectometers also suffer from penetration issues that limit their effectiveness when measuring high aspect ratio structures.

To overcome penetration depth issues, traditional imaging techniques such as TEM, SEM etc., are employed with destructive sample preparation techniques such as focused ion beam (FIB) machining, ion milling, blanket or selective etching, etc. For example, transmission electron microscopes (TEM) achieve high resolution levels and are able to probe arbitrary depths, but TEM requires destructive sectioning of the specimen. Several iterations of material removal and measurement generally provide the information required to measure the critical metrology parameters throughout a three dimensional structure. But, these techniques require sample destruction and lengthy process times. The complexity and time to complete these types of measurements introduces large inaccuracies due to drift of etching and metrology steps. In addition, these techniques require numerous iterations which introduce registration errors.

X-Ray scatterometry systems have shown promise to address challenging measurement applications. Measurements of scattered orders provide signal information to determine some specimen properties of interest. Typically a small-angle x-ray scatterometry (SAXS) data set is collected from measurements of a wafer after a critical process step. The data set includes images of diffraction patterns at one or more angles of incidence. A geometric model of the entire unit cell of the target structure is generated and incorporated into a measurement model. A physics-based solver generates simulated diffraction patterns for a given set of values of geometric and system parameter values of the measurement model. A number of the parameters of the measurement model are floated in a regression analysis to find parameter values that minimize the residual between the measured and simulated diffraction patterns. The geometric parameter values that result in the best fit are considered the measured parameter values associated with the measurement on the wafer.

Structures fabricated on a wafer become increasingly complex as the wafer proceeds through the semiconductor wafer fabrication process flow. As a result, geometric models of the entire unit cell of periodic structures fabricated on a wafer become increasingly complex as the number of processes applied to the wafer increases.

Typically many parameters must be fitted simultaneously to resolve complex geometric models. This makes the measurement process computationally expensive or computationally intractable in some cases. A large and complicated unit cell requires measurement of many diffraction orders to account for all the signal information in the diffraction patterns. Again, processing of many diffraction orders is computationally expensive. Finally, despite best efforts, a geometric model representative of a complex structure may miss subtle features that arise due to process variations, or it may fail to fully describe the nominal structure. Deficiencies in the geometric model may make it intractable to fit or drive the fit routine to estimate wildly inaccurate parameter values to compensate for model inadequacies.

To further improve device performance, the semiconductor industry continues to focus on vertical integration, rather than lateral scaling. Thus, accurate measurement of complex, fully three dimensional structures is crucial to ensure viability and continued scaling improvements. Future metrology applications present challenges for metrology due to increasingly small resolution requirements, multi-parameter correlation, increasingly complex geometric structures including high aspect ratio structures, and increasing use of opaque materials. Thus, methods and systems for improved x-ray scatterometry measurements are desired.

SUMMARY

Methods and systems for measuring a complex semiconductor structure after a critical process step are presented. The estimation of the one or more geometric parameters of interest is based on measurement data associated with the complex semiconductor structure before and after the critical process step. The use of measurement data both before and after a critical process step enables faster model generation and model fitting with reduced computational effort. In some examples, the simplified measurement model enables more accurate estimation of parameters of interest than traditional, complex model generation and fitting.

In one aspect, the measurement of a complex semiconductor structure after a critical process step is based on x-ray scatterometry measurement data associated with the complex semiconductor structure both before and after the critical process step. Under the assumption that different shapes within a unit cell are spatially separated with sufficient distance to minimize coherence effects, the measured diffraction pattern is approximated as a linear combination of Fourier components, each associated with a different shape. An estimate of a geometric parameter of interest that is changed by the critical process step is based on fitting combined measurement data to a simplified geometric model of the measured structure. In some embodiments, the combined measurement data is determined based on subtraction of the diffraction pattern before the critical process step from the measured diffraction pattern after the critical process step. In some embodiments, the simplified geometric model of the measured structure includes only the feature(s) affected by the critical process step. As a result, the simplified geometric model includes a smaller number of floated geometric parameters compared to a complete geometric model of the structures captured in measurements performed after the critical process step.

In another aspect, metrology based on combined x-ray scatterometry data involves determining the dimensions of a sample based on the combined data set and a trained signal response metrology (SRM) model. In these examples, the critical dimensions are directly correlated to the combined data sets without a geometric model. In a further aspect, a trained signal response metrology model is employed to estimate values of structural parameters of interest having unknown values based on combined measurement signals.

In another aspect, the estimation of one or more geometric parameters of interest of a complex semiconductor structure after a critical process step is based on actual x-ray scatterometry measurement data associated with the complex semiconductor structure after the critical process step and simulated x-ray scatterometry measurement data associated with the complex semiconductor structure before the critical process step.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for estimating values of one or more geometric parameters of interest of a complex semiconductor structure after a critical process step are presented herein. In particular, the estimation of the one or more geometric parameters of interest is based on measurement data associated with the complex semiconductor structure before and after the critical process step. The use of measurement data both before and after a critical process step enables faster model generation and model fitting with reduced computational effort. In some examples, the simplified measurement model enables more accurate estimation of parameters of interest than traditional, complex model generation and fitting.

Figure 1:
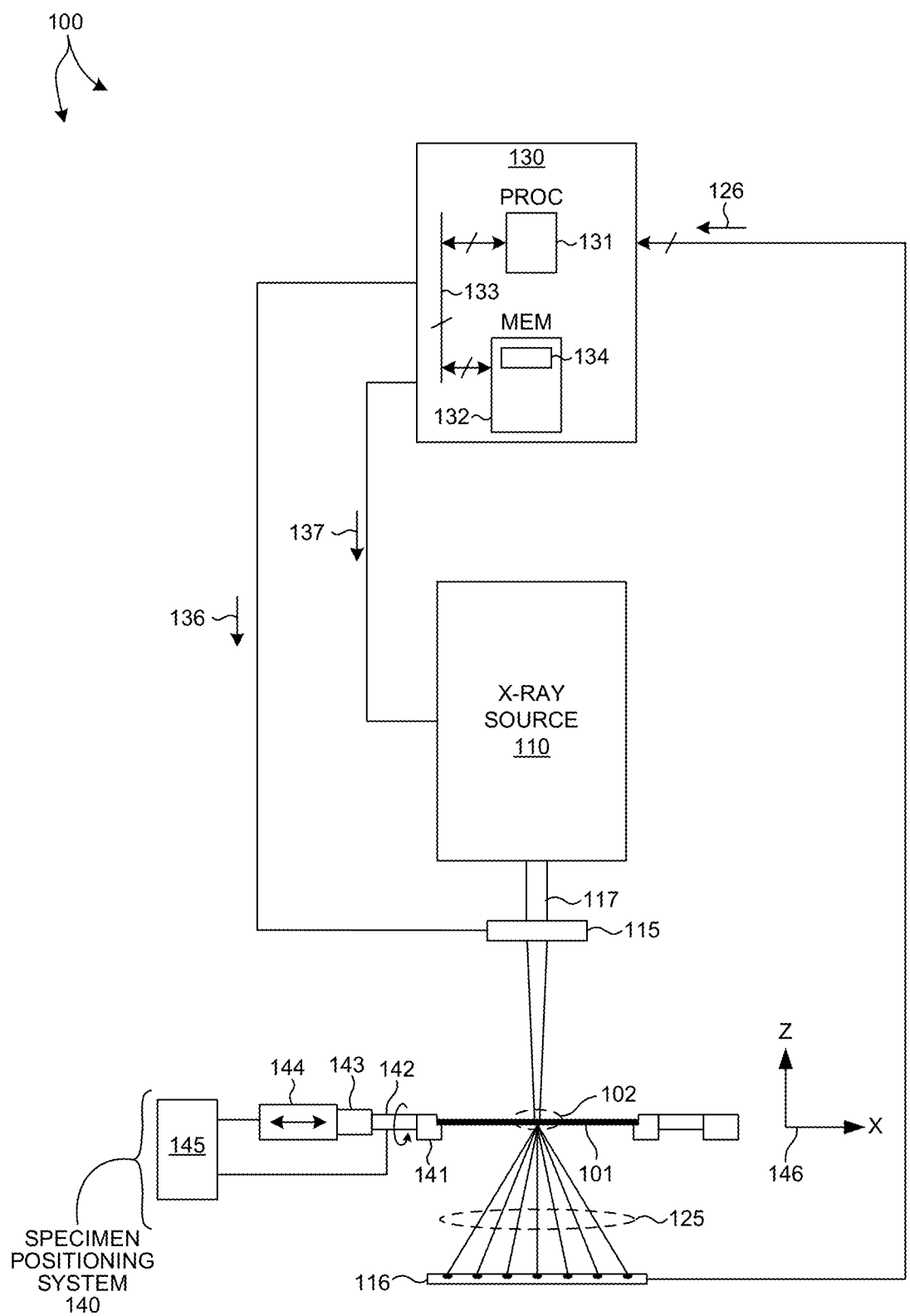
FIG. 1 is a simplified diagram illustrative of an embodiment of a metrology tool for measuring characteristics of a specimen in accordance with the exemplary methods presented herein.

FIG. 1 illustrates an embodiment of a metrology tool 100 for measuring characteristics of a specimen in accordance with the exemplary methods presented herein. As shown in FIG. 1, the system 100 may be used to perform x-ray scatterometry measurements over a measurement area 102 of a specimen 101 disposed on a specimen positioning system 140. In some embodiments, the measurement area 102 has a spot size of eighty micrometers or less. In some embodiments, the measurement area 102 has a spot size of fifty micrometers or less. In some embodiments, the measurement area 102 has a spot size of forty micrometers or less.

In the depicted embodiment, metrology tool 100 includes an x-ray illumination source 110 that generates x-ray radiation suitable for x-ray scatterometry measurements. In some embodiments, the x-ray illumination source 110 generates wavelengths between 0.01 nanometers and 1 nanometer. X-ray illumination source 110 produces an x-ray beam 117 incident on inspection area 102 of specimen 101.

In general, any suitable high-brightness x-ray illumination source capable of generating high brightness x-rays at flux levels sufficient to enable high-throughput, inline metrology may be contemplated to supply x-ray illumination for x-ray scatterometry measurements as described herein. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, and an inverse Compton source may be employed as x-ray source 110. In one example, an inverse Compton source available from Lyncean Technologies, Inc., Palo Alto, California (USA) may be contemplated. Inverse Compton sources have an additional advantage of being able to produce x-rays over a range of photon energies, thereby enabling the x-ray source to deliver x-ray radiation at different, selectable wavelengths. Exemplary x-ray sources include electron beam sources configured to bombard solid or liquid targets to stimulate x-ray radiation. In some embodiments, x-ray illumination source 110 is a liquid metal based x-ray illumination system. A jet of liquid metal including one or more elements is generated. By way of non-limiting example, the jet of liquid metal includes any of Aluminum, Gallium, Indium, Tin, Thallium, and Bismuth. An electron beam source (e.g., electron gun) produces a stream of electrons directed by electron optics to the jet of liquid metal. Suitable electron optics include electromagnets, permanent magnets, or a combination of electromagnets and permanent magnets for focusing the electron beam and directing the beam at the liquid metal jet. The coincidence of the jet of liquid metal and the stream of electrons produces an x-ray beam 117 incident on inspection area 102 of specimen 101. In this manner, the jet of liquid metal produces x-ray lines corresponding with its constituent elements. In one embodiment, the jet of liquid metal includes a Gallium and Indium alloy.

Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

In one embodiment, the incident x-ray beam 117 is at the Indium kα line of 24.2 keV. The x-ray beam is collimated down to less than one milliradian divergence using multi-layer x-ray optics for x-ray scatterometry measurements.

In some embodiments, the x-ray scattering measurements described herein are achieved without using a screen located between the x-ray source and the specimen under measurement. In these embodiments, the measured intensities of the beam over a range of angles of incidence, multiple wavelengths, or a combination of both, provide sufficient information to resolve a distribution map (i.e., image) of a desired material property (e.g., complex refractive index, electron density, or absorptivity) of the measured structure. However, in some other examples, a pinhole or another aperture is located on an otherwise opaque screen that is located between the x-ray source and the specimen under measurement to improve collimation of the x-ray beam. The intensity of the diffraction pattern is measured for several positions of the aperture. In some other embodiments, a screen with a pseudo-random aperture pattern is used, and the diffraction pattern is measured for multiple screens. These approaches may also be contemplated to provide additional information to resolve the three-dimensional distribution of the desired material property of the measured structure.

In some embodiments, the profile of the incident x-ray beam is controlled by two or more apertures, slits, or a combination thereof. In a further embodiment, the apertures, slits, or both, are configured to rotate in coordination with the orientation of the specimen to optimize the profile of the incident beam for each angle of incidence, azimuth angle, or both.

As depicted in FIG. 1, x-ray optics 115 shape and direct incident x-ray beam 117 to specimen 101. In some examples, x-ray optics 115 include an x-ray monochromator to monochromatize the x-ray beam that is incident on the specimen 101. In one example, a crystal monochromator such as a Loxley-Tanner-Bowen monochromator is employed to monochromatize the beam of x-ray radiation. In some examples, x-ray optics 115 collimate or focus the x-ray beam 117 onto inspection area 102 of specimen 101 to less than 1 milliradian divergence using multilayer x-ray optics. In some embodiments, x-ray optics 115 includes one or more x-ray collimating mirrors, x-ray apertures, x-ray beam stops, refractive x-ray optics, diffractive optics such as zone plates, specular x-ray optics such as grazing incidence ellipsoidal mirrors, polycapillary optics such as hollow capillary x-ray waveguides, multilayer optics, or systems, or any combination thereof. Further details are described in U.S. Patent Publication No. 2015/0110249, the content of which is incorporated herein by reference it its entirety.

In general, the focal plane of the illumination optics system is optimized for each measurement application. In this manner, system 100 is configured to locate the focal plane at various depths within the specimen depending on the measurement application.

X-ray detector 116 collects x-ray radiation 125 scattered from specimen 101 and generates an output signal 126 indicative of properties of specimen 101 that are sensitive to the incident x-ray radiation. In some embodiments, scattered x-rays 125 are collected by x-ray detector 116 while specimen positioning system 140 locates and orients specimen 101 to produce angularly resolved scattered x-rays.

Metrology system 100 includes one or more photon counting detectors with high dynamic range (e.g., greater than $10^5$) and thick, highly absorptive crystal substrates that absorb the direct beam (i.e., zero order beam) without damage and with minimal parasitic backscattering. Exemplary detector materials suitable for full beam x-ray scatterometry include Cadmium Telluride (CdTe), Germanium (Ge) and Gallium Arsenide (GaAs) crystals, and others. In some embodiments, the detector material is selected to provide high conversion efficiency in a narrow energy band corresponding to the source energy.

In some embodiments, a single photon counting detector detects the position and number of detected photons. In some embodiments, dual threshold detectors are employed to improve SNR.

X-ray detector 116 resolves one or more x-ray photon energies and produces signals for each x-ray energy component indicative of properties of the specimen. In some embodiments, the x-ray detector 116 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 126 for further processing and storage.

A high aspect ratio, vertically manufactured structure diffracts a collimated X-ray beam into diffraction orders. Each diffraction order travels in a particular, predictable direction. The angular spacing of the diffraction orders is inversely proportional to the lattice constant of the specimen divided by the wavelength. The diffraction orders are detected by a detector array placed at some distance from the wafer. Each pixel of the detector outputs a signal that indicates the number of photons that hit the pixel.

The intensities of diffraction orders are of the form $I(m,n,\theta,\phi,\lambda)$, where $\{m,n\}$ are integer indices of diffraction orders, $\{\theta,\phi\}$ are elevation and azimuth angles of the incident beam (i.e., polar coordinates of the incident chief ray with respect to a coordinate system that is fixed to the wafer), and $\lambda$ is the wavelength of the incident X-ray.

Several noise sources perturb the illumination light as it exits the illumination and propagates toward the specimen. Exemplary disturbances include electron beam current fluctuation, temperature induced optic drift, etc. The perturbed incident flux is denoted as $F_0(1+n_1)$.

The target scatters the incident radiation in a manner that depends on the azimuth and elevation angles of the incident beam. The efficiency of light scattering into orders (m,n) can be defined as $S_{mn}(\theta,\phi)$. As the diffracted light propagates from the specimen to the detector, the beam passes through other scattering media that affect all orders similarly with some variation $(1+n_2)$ and parasitic noise $(n_3)$. In this manner the total intensity $I_{mn}$ of each order measured in a time, t, can be expressed by equation (1).

$$I_{mn} = S_{mn}(\theta,\phi)(1+n_2)(1+n_1)F_0 t + n_3 \tag{1}$$

The intensity of each order can be extracted in many ways. In some embodiments, the diffraction orders are spatially separated at the detector. In these embodiments, the diffraction orders are individually detected by the detector array, and the outputs of pixels associated with the same diffraction order are combined (i.e., added). In this manner, detected diffraction orders are discriminated by accumulating photon counts of pixels associated with each particular diffraction order. This scenario is more likely to occur when measuring relatively small pitch features or when measuring with a beam having a relatively small divergence.

In some other embodiments, the diffraction orders spatially overlap at the detector and the pixel outputs cannot simply be combined to determine the intensity associated with a particular diffraction order. In these embodiments, a measurement model is employed to deconvolve the diffraction orders to discriminate the measured intensity of each detected diffraction order. This scenario is more likely to occur when measuring relatively large pitch features or when measuring with a beam having a relatively large divergence.

As depicted in FIG. 1, metrology system 100 includes a computing system 130 employed to acquire signals 126 generated by detector 116 and determine properties of the structure of interest based at least in part on the acquired signals.

In one aspect, the estimation of one or more geometric parameters of interest of a complex semiconductor structure after a critical process step is based on x-ray scatterometry measurement data associated with the complex semiconductor structure both before and after the critical process step. In the simplest physical model of x-ray scattering, the diffraction pattern intensity is linearly proportional to the squared form factor of the shapes within the unit cell, or equivalently the squared Fourier transform of the unit cell. Under the assumption that the different shapes within the unit cell are spatially separated with sufficient distance to minimize coherence effects, the measured diffraction pattern can be approximated as a linear combination of Fourier components, each associated with a different shape. Thus, the measured diffraction pattern after a critical process step is the sum of a diffraction pattern before the critical process step and a diffraction pattern that results from the shape or shapes that are changed by the critical process step. In this manner, an estimate of a geometric parameter of interest that is changed by the critical process step can be made based on a subtraction of the diffraction pattern before the critical process step from the measured diffraction pattern after the critical process step.

Figure 2:
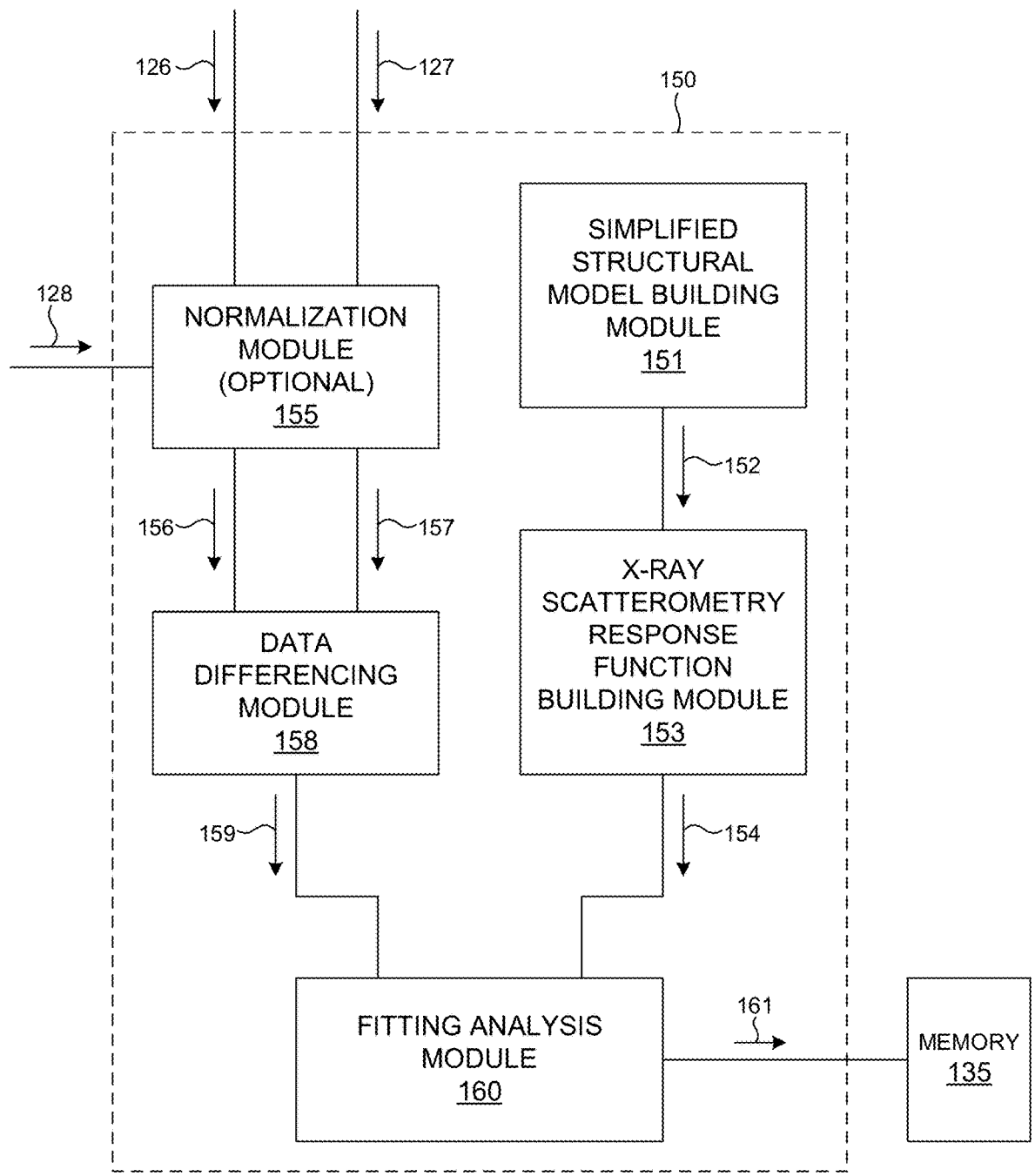
FIG. 2 is a diagram illustrative of an embodiment of a model building and analysis engine to estimate values of one or more geometric parameters characterizing a complex semiconductor structure based on x-ray scatterometry measurement data both before and after a critical process step.

FIG. 2 depicts an illustration of an embodiment of a model building and analysis engine 150 to estimate values of one or more geometric parameters characterizing a complex semiconductor structure based on x-ray scatterometry measurement data associated with the complex semiconductor structure both before and after a critical process step. In some embodiments, x-ray scatterometry data 126 and 127 is collected from a wafer by an x-ray scatterometry system such as metrology system 100 depicted in FIG. 1. X-ray scatterometry data 126 is collected after a critical process step is performed on wafer 101, and x-ray scatterometry data 127 is collected before the critical process step is performed on wafer 101.

Figure 6:
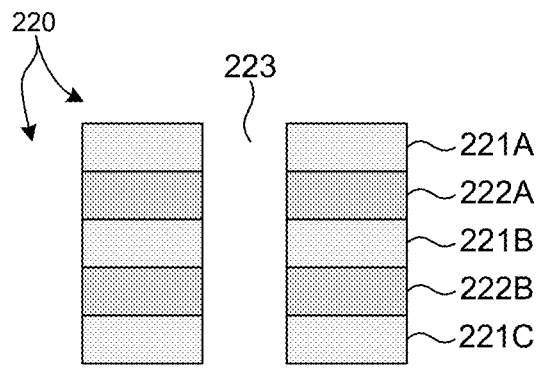
FIG. 6 is a simplified diagram illustrative of a cross-sectional view of a semiconductor structure before a critical process step in one embodiment.

FIG. 6 depicts a cross-sectional view of a semiconductor structure before a critical process step in one embodiment. FIG. 6 depicts a multiple layer structure 220 including a channel hole 223 through repeated oxide layers 221A-C and nitride layers 222A-B.

Figure 7:
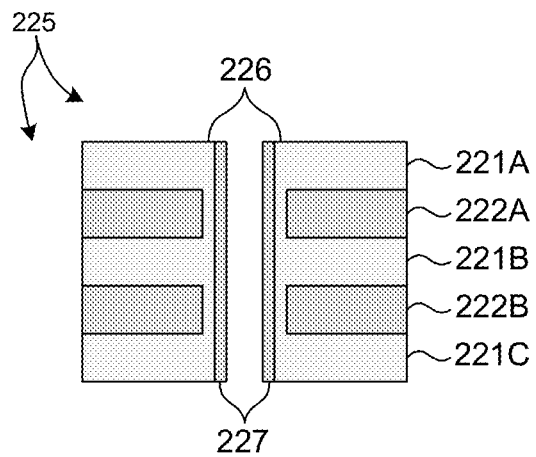
FIG. 7 is a simplified diagram illustrative of a cross-sectional view of the multiple layer structure depicted in FIG. 6 after a critical process step.

FIG. 7 depicts a cross-sectional view of the multiple layer structure depicted in FIG. 6 after a critical process step. In the embodiment, depicted in FIG. 7, the critical process step is a deposition of liner 226 and liner 227 to the sidewall of channel hole 223 to generate multiple layer structure 225.

Figure 8:
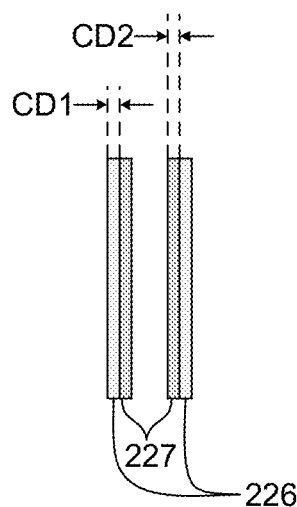
FIG. 8 is a diagram illustrative of a cross-sectional view of liner structures depicted in FIG. 7.

FIG. 8 depicts a cross-sectional view of liners 226 and 227 depicted in FIG. 7. In the embodiment depicted in FIGS. 6-8, the thickness, CD1, of liner 226 and the thickness, CD2, of liner 227 are critical dimensions of interest.

The measurement of CD1 and CD2 from x-ray scatterometry data collected from multiple layer structure 225 depicted in FIG. 7 is complicated by the presence of the multiple layer structure 220. Ideally, one would measure CD1 and CD2 from x-ray scatterometry data collected from liner structures 226 and 227 alone. However, liner structures 226 and 227 are never present in isolation on an actual wafer because the liner deposition process occurs after the hole process through multiple layers 221 and 222. As described herein, x-ray scatterometry data collected from multiple layer structure 220 is subtracted from x-ray scatterometry data collected from multiple layer structure 225. In this manner, the influence of multiple layers 221 and 222 and hole 223 on measured diffraction is subtracted from the measured diffraction associated with multiple layer structure 225. The resulting diffraction pattern closely represents the scattering response of liners 226 and 227 without the influence of multiple layers 221 and 222 and hole 223. Analysis of the resulting diffraction pattern yields a more accurate estimate of CD1 and CD2 with reduced computational effort.

Figure 9:
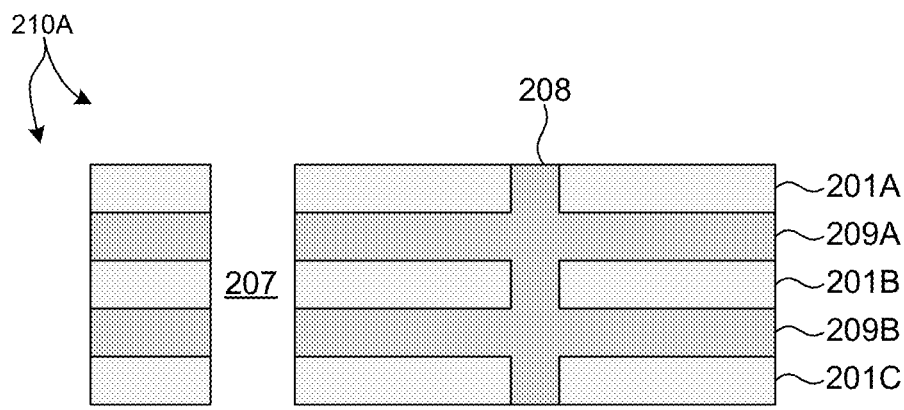
FIG. 9 is a diagram illustrative of a cross-sectional view of a semiconductor structure before a critical process step in another embodiment.

FIG. 9 depicts a cross-sectional view of a semiconductor structure before a critical process step in another embodiment. FIG. 9 depicts a multiple layer structure 210A including vertical patterning (alternating oxide layers 201A-C and tungsten layers 209A-B), channel hole 207, and a word line cut structure 208 filled with tungsten.

Figure 10:
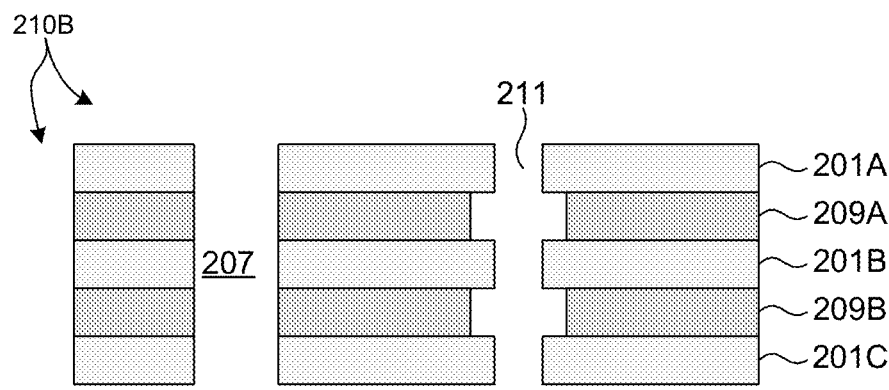
FIG. 10 is a diagram illustrative of a cross-sectional view of the multiple layer structure depicted in FIG. 9 after a tungsten recess process step.

FIG. 10 depicts a cross-sectional view of the multiple layer structure depicted in FIG. 9 after a tungsten recess process step. In the embodiment depicted in FIG. 10, the tungsten is etched so that each tungsten slab is recessed a small distance relative to the oxide slabs.

Figure 11:
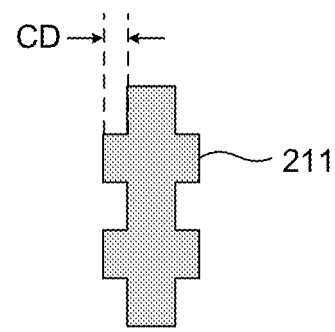
FIG. 11 is a diagram illustrative of a cross-sectional view of tungsten recess structure that has been removed from a multiple layer structure by the tungsten recess process.

FIG. 11 depicts a cross-sectional view of tungsten recess structure 211 that has been removed from multiple layer structure 210 by the tungsten recess process. In the embodiment depicted in FIGS. 9-11, the recess distance, CD, is the critical dimension of interest.

The measurement of CD from x-ray scatterometry data collected from multiple layer structure 210B depicted in FIG. 10 is complicated by the presence of the multiple layer structure 210A. Ideally, one would measure CD from x-ray scatterometry data collected from tungsten recess structure 211 alone. However, tungsten recess structure 211 is never present in isolation on an actual wafer because the tungsten recess process occurs after the vertical patterning process, hole process, and word cut process. As described herein, x-ray scatterometry data collected from multiple layer structure 210A is subtracted from x-ray scatterometry data collected from multiple layer structure 210B. In this manner, the influence of multiple layers 201 and 209, hole 207, and word cut 208 on measured diffraction is subtracted from the measured diffraction associated with multiple layer structure 210B. The resulting diffraction pattern closely represents the scattering response of tungsten recess structure 211 without the influence of multiple layers 201 and 209, hole 207, and word cut 208. Analysis of the resulting diffraction pattern yields a more accurate estimate of CD with reduced computational effort.

Figure 12:
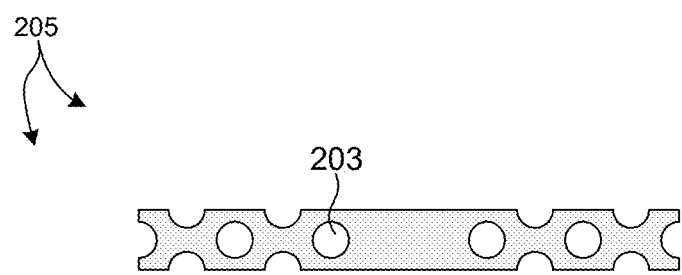
FIG. 12 is a diagram illustrative of a top view of a semiconductor structure before a critical process step in another embodiment.

FIG. 12 depicts a top view of a semiconductor structure before a critical process step in another embodiment. FIG. 12 depicts a structure 205 including a hole pattern 203.

Figure 13:
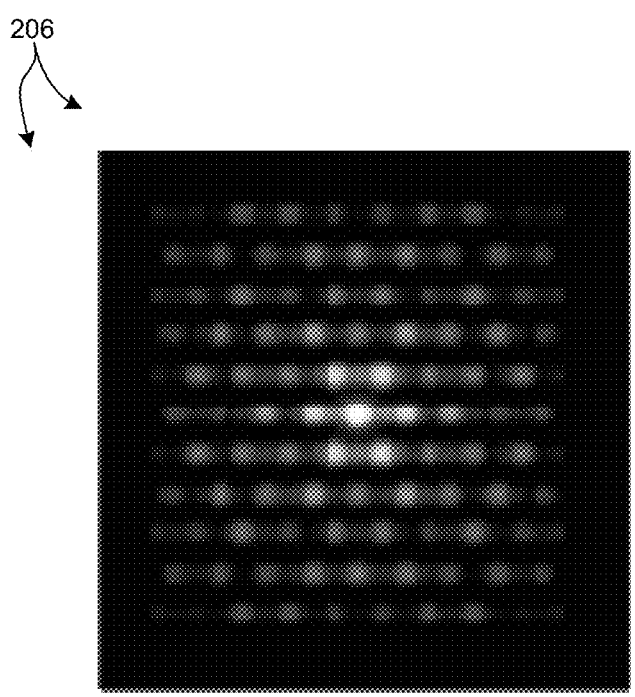
FIG. 13 is an image illustrative of a diffraction pattern from a structure measured by an x-ray scatterometer in one example.

FIG. 13 depicts an image 206 illustrative of a diffraction pattern from structure 205 measured by an x-ray scatterometer (e.g., metrology system 100).

Figure 14:
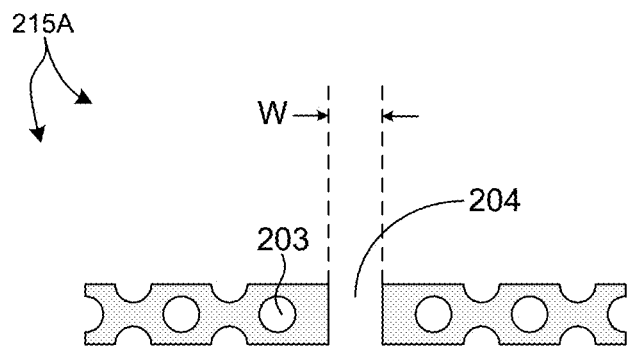
FIG. 14 is a diagram illustrative of a top view of the structure depicted in FIG. 12 after a slit removal process step.

FIG. 14 depicts a top view of the structure depicted in FIG. 12 after a slit removal process step. In the embodiment depicted in FIG. 14, structure 205 is etched so that a slit 204 is formed resulting in structure 215A.

Figure 15:
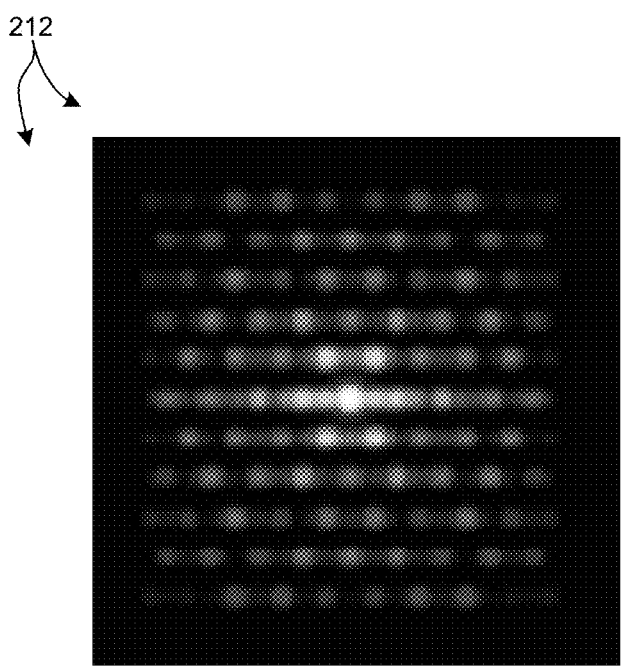
FIG. 15 is an image illustrative of a diffraction pattern from a structure measured by the x-ray scatterometer employed to measure the structure depicted in FIG. 12.

FIG. 15 depicts an image 212 illustrative of a diffraction pattern from structure 215A measured by the x-ray scatterometer (e.g., metrology system 100) employed to measure structure 205 depicted in FIG. 12.

Figure 16:
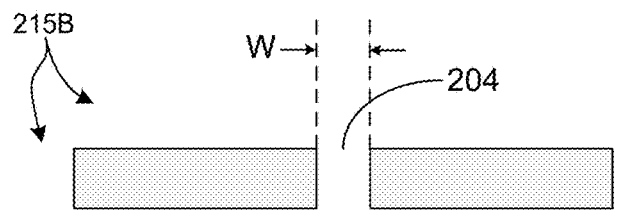
FIG. 16 is a diagram illustrative of a top view of a structure including a slit structure without a hole pattern.

FIG. 16 depicts a top view of a structure 215B including slit 204 without hole pattern 203. In the embodiment depicted in FIGS. 14 and 16, the width, W, of slit 204 is the critical dimension of interest.

The measurement of W from x-ray scatterometry data collected from multiple layer structure 215A depicted in FIG. 14 is complicated by the presence of the multiple hole pattern 203. Ideally, one would measure W from x-ray scatterometry data collected from the structure 215B alone.

However, slit 204 is never present in isolation on an actual wafer because the slit removal process occurs after the hole process. As described herein, x-ray scatterometry data collected from multiple layer structure 205 is subtracted from x-ray scatterometry data collected from multiple layer structure 215A. In this manner, the influence of hole pattern 203 on measured diffraction is subtracted from the measured diffraction associated with multiple layer structure 215A. The resulting diffraction pattern closely represents the scattering response of slit structure 203 without the influence of hole pattern 203. Analysis of the resulting diffraction pattern yields a more accurate estimate of W with reduced computational effort.

Figure 17:
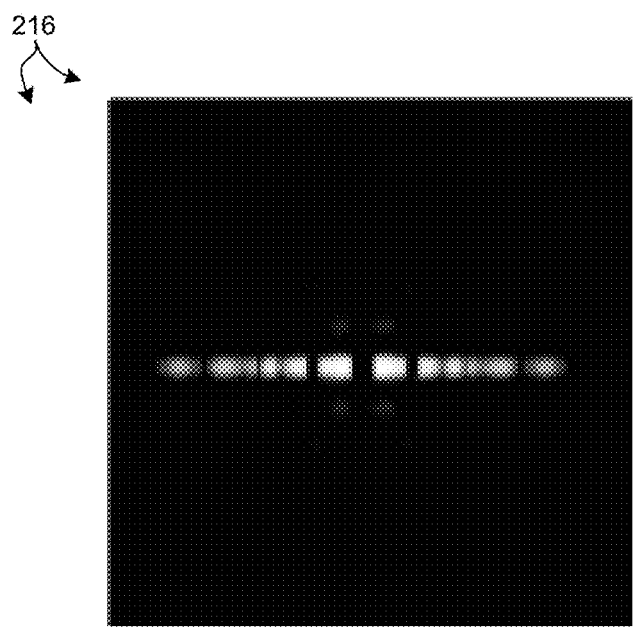
FIG. 17 is an image illustrative of a pixel by pixel subtraction of the measured diffraction pattern depicted in FIG. 13 from the measured diffraction pattern depicted from FIG. 15.

FIG. 17 depicts an image 216 illustrative of a pixel by pixel subtraction of the measured diffraction pattern 206 depicted in FIG. 13 from the measured diffraction pattern 212 depicted from FIG. 15. The resulting diffraction pattern is representative of the measurement response of ideal structure 215B by the x-ray scatterometer (e.g., metrology system 100).

Figure 18:
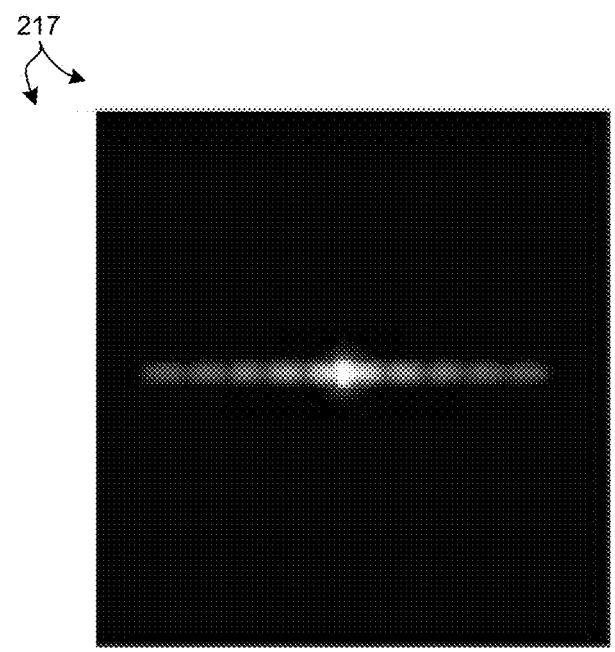
FIG. 18 is an image illustrative of a simulation of a diffraction pattern from a structure measured by the x-ray scatterometer.

FIG. 18 depicts an image 217 illustrative of a simulation of a diffraction pattern from structure 215B measured by the x-ray scatterometer (e.g., metrology system 100) employed to measure structure 205 and 215A. As illustrated in FIGS. 17 and 18, the simulated response of structure 215B to measurement by the x-ray scatterometer is very closely approximated by pixel by pixel subtraction of the measured diffraction pattern 206 depicted in FIG. 13 from the measured diffraction pattern 212 depicted from FIG. 15.

In some embodiments, x-ray scatterometry data 126, x-ray scatterometry data 127, or both, are normalized with respect to system parameter values of metrology system 100 associated with each data set. In general, data sets collected before and after a critical process step likely have different values of one or more system parameters (e.g., beam intensity, beam center, beamline orientation, etc.). To reliably combine data sets, one or both data sets are corrected to match the system parameter values associated with both data sets.

In some examples, the nominal system parameter values available from the metrology system itself are relied upon for purposes of normalization. However, in many measurement scenarios, the nominal system parameter values reported by the metrology system are not sufficiently accurate. In many of these examples, the system parameter values associated with each data set are determined based on a model-based fitting of the measurement data while floating the system parameter values.

As depicted in FIG. 2, normalization module 155 receives x-ray scatterometry data 127 collected before the critical process step, x-ray scatterometry data 126 collected after the critical process step, and a measurement model 128 associated with the collection of x-ray scatterometery data 127, before the critical process step. A model-based fitting of x-ray scatterometry data 127 and measurement data predicted by measurement model 128 is performed while floating one or more system parameter values. The determined system parameter values are treated as the actual system parameter values associated with x-ray scatterometry data 127. As described hereinbefore, a measurement model associated with a complex semiconductor structure fabricated by a critical process step is often difficult to accurately model. Rather than attempt to accurately model the measured response of the complex semiconductor structure after the critical process step, a model-based fitting of a subset of x-ray scatterometry data 126 and measurement data predicted by measurement model 128 is performed while floating one or more system parameter values. The model-based fitting is performed with a subset of x-ray scatterometry data 126 that is minimally affected by the presence of the complex semiconductor structure. In one example, x-ray scatterometry data 126 is a measured diffraction pattern from structure 215A measured by metrology system 100. The measured diffraction pattern is illustrated by image 212 of FIG. 15. Furthermore, the simulated diffraction pattern from structure 215B as measured by metrology system 100 in depicted in FIG. 18. In this example, the pixels of image 217 depicted in FIG. 18 having a non-zero value (e.g., pixels having an intensity value above zero) or relatively small value (e.g., pixels having an intensity value greater than a predetermined threshold value) are identified. Next, the corresponding pixels of image 212 depicted in FIG. 15 are assigned a zero value. A fitting of the resulting image (i.e., subset of x-ray scatterometry data 126) and measurement data predicted by measurement model 128 is performed while floating one or more system parameter values to identify the system parameter values associated with data set 126.

Data set 126, 127, or both are corrected to match the system parameter values associated with both data sets. In one example, data set 126 is corrected to match the system parameter values associated with data set 127. In another example, data set 127 is corrected to match the system parameter values associated with data set 126. In yet another example, both data sets 126 and 127 are corrected to match a predetermined set of system parameter values.

As depicted in FIG. 2, normalized data set 156 derived from data set 126 and normalized data set 157 derived from data set 127 are communicated to data differencing module 158. Data differencing module combined normalized data sets 156 and 157 to generated combined data set 159 communicated to fitting analysis module 160. In one example, data differencing module determines a pixel by pixel difference between data sets 156 and 157 as combined data set 159.

Although it is preferred to normalize x-ray scatterometry data associated with measurements of a structure of interest before and after a critical process step, in general, it is not required. In this sense, normalization block 155 is optional.

In some embodiments, actual x-ray scatterometry data is collected from an x-ray scatterometry system (e.g., metrology system 100) both before and after a critical process step. However, in some other embodiments, x-ray scatterometry data before a critical process step is generated synthetically based on actual scatterometry data collected from an x-ray scatterometer system (e.g., metrology system 100) after the critical process step. For example, in some embodiments, x-ray scatterometry data 127 is generated synthetically based on x-ray scatterometry data 126 collected from the x-ray scatterometry system (e.g., metrology system 100) after the critical process step. In these embodiments, a pattern recognition algorithm, such as a patch matching algorithm is employed to generate a simulated x-ray scatterometry data set before a critical process step. The actual x-ray scatterometry data (e.g., x-ray scatterometry data 126) is evaluated to identify one or more regions (e.g., groups of image pixels) associated the structure of interest, i.e., the structure changed by the critical process. The measured values within the one or more regions are replaced by values identified by a patch matching algorithm that generates a diffraction pattern that is continuous with the measured pattern outside the one or more regions of interest. In one example, FIG. 15 illustrates an image 212 of a measured diffraction pattern from structure 215A measured by the x-ray scatterometer (e.g., metrology system 100). As depicted in FIG. 14, structure 215A includes both hole structures 203 and the structure of interest, slit structure 204. FIG. 18 depicts an image 217 illustrative of a simulation of a diffraction pattern including only the slit structure 204 measured by the x-ray scatterometer (e.g., metrology system 100). The region of interest includes the pixels of image 217 having measurable signal value (e.g., pixels having values significantly greater than the noise floor of the x-ray scatterometry system). The identified pixels from image 217 are replaced in the image 212 depicted in FIG. 15 by a patch matching algorithm. The replacement values generate a diffraction pattern that is continuous with the pattern outside the region of interest. Furthermore, the resulting diffraction pattern is representative of the measured response of a structure having hole structures only and no slit structure. The resulting data set is subtracted from data set 126 to by data differencing module 158 to generate combined data set 159 communicated to fitting analysis module 160. In these embodiments normalization is not required because the x-ray scatterometry data before a critical process step is generated synthetically based on actual scatterometry data collected from an x-ray scatterometer system. Additional description of a suitable patch matching algorithm is described in the article entitled, "PatchMatch: A Randomized Correspondence Algorithm for Structural Image Editing" by Barnes et al., and available on-line at https://gfx.cs.princeton.edu/pubs/Barnes_2009_PAR/patchmatch.pdf.

In a further aspect, model building and analysis engine 150 includes simplified structural model building module 151. Simplified structural model building module 151 generates a simplified geometric model 152 including a subset of the geometric features of the structures measured after the critical process step. In some embodiments, only the one or more features affected by the critical process step are included in the simplified geometric model 152. As a result, the simplified geometric model 152 includes a smaller number of floated geometric parameters compared to a complete geometric model of the structures captured in measurements performed after the critical process step.

In one example, FIG. 8 depicts a simplified geometric model capturing only liners 226 and 227. In another example, FIG. 11 depicts a simplified geometric model capturing only tungsten recess structure 211. In yet another example, FIG. 16 depicts a simplified geometric model capturing only slit structure 204.

Simplified geometric model 152 is communicated to x-ray scatterometry response function model building module 153. X-ray scatterometry response function model building module 153 generates a simplified measurement response model 154 based on the simplified geometric model 152. The simplified measurement response model 154 simulates the response of the simplified geometric structure to measurement by an x-ray scatterometry system (e.g., metrology system 100). Simplified measurement response model 154 is communicated to fitting analysis module 160.

By modeling only the one or more features affected by the critical process step, the geometric model and the x-ray measurement response model are much easier to generate. Furthermore, the resulting simplified measurement response model is much easier to fit than a much more complex measurement model capturing all of the geometric features of the measured structures captured by the measurement after the critical process step.

In some examples, metrology based on combined x-ray scatterometry data involves determining the dimensions of the sample by the inverse solution of a simplified measurement model (e.g., simplified measurement response model 154) with the combined data (e.g., combined data set 159). The measurement model includes a few (on the order of ten) adjustable parameters and is representative of the geometry and optical properties of the structure of interest and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the combined data and modeled results.

Fitting analysis module 160 performs a regression on the combined data set 159 using the simplified measurement response model 154 to estimate values of one or more critical dimensions 161. The estimated values 161 are stored in memory 135. The geometric parameters of interest are floated. In some embodiments, additional parameters, such as the intensity of each independent order, are also floated to account for imperfect removal of feature(s) not affected by the critical process step. In some embodiments, a least-squares regression is performed on the combined data set 159 using simplified measurement response model 154 to estimate values of one or more critical dimension.

$$\Sigma_{pixels}(\text{ChangedStruct}_{Sim} - (\text{SubsequentStruct}_{Meas} - \text{PriorStruct}_{Meas}))^2 \quad (1)$$

Equation (1) illustrates an exemplary objective function of a least squares regression in one non-limiting example. As illustrated in equation (1), the term ChangedStruct$_{sim}$ is the output of the simplified measurement response model. These are simulated diffraction signals based on the simplified geometric model that focuses only on the features of the measured structure that are changed by the critical process step. The term SubsequentStruct represents the diffraction signals measured by the x-ray scatterometer system after the critical process step, and the term PriorStruct$_{Meas}$ represents the diffraction signals measured by the x-ray scatterometer system before the critical process step. The difference term (SubsequentStruct$_{Meas}$–PriorStruct$_{Meas}$) is the combined data set.

In another aspect, metrology based on combined x-ray scatterometry data involves determining the dimensions of a sample based on the combined data set and a trained signal response metrology (SRM) model. In these examples, the critical dimensions are directly correlated to the combined data sets without a geometric model.

Figure 3:
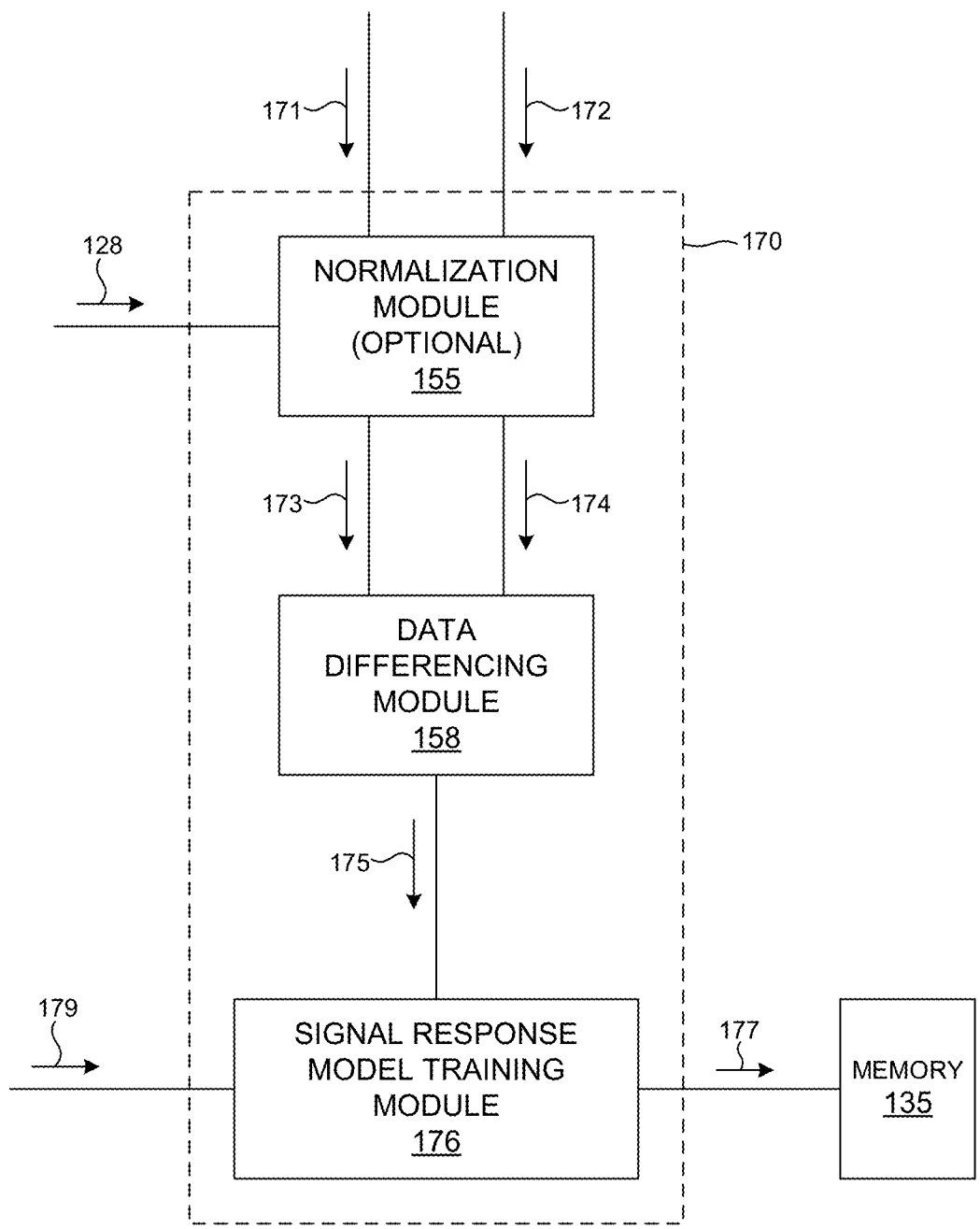
FIG. 3 is a diagram illustrative of a SRM model training engine.

FIG. 3 depicts a diagram illustrative of a SRM model training engine 170. As depicted in FIG. 3, training data includes x-ray scatterometry data 172 collected after a critical process step, and x-ray scatterometry data 171 collected before the critical process step. Data sets 171 and 172 correspond to structures having known values of one or more parameters of interest 179. Data sets 171 and 172 are normalized by normalization module 155 as described hereinbefore and normalized data sets 173 and 174 are communicated to data differencing module 158. Combined data set 175 is generated by data differencing module 158 from normalized data sets 173 and 174 as described hereinbefore. Combined data set 175 and corresponding known values of one or more parameters of interest 179 are communicated to SRM training module 176. SRM training module generates a trained SRM model 177 based on the combined data set 175 and corresponding known values of one or more parameters of interest 179. The trained SRM model 177 is stored in memory 135.

The known values of one or more parameters of interest 179 are measured by a trusted measurement system such as a Scanning Electron Microscope (SEM), Tunneling electron Microscope (TEM), Atomic Force Microscope (AFM), or an x-ray measurement system such as a Small-Angle X-Ray Scatterometer (SAXS) or an X-Ray Fluorescence (XRF) system that is able to accurately measure the parameter value. However, typically, the reference metrology system generally lacks the capability to operate as an inline metrology system, for example, due to low throughput, high measurement uncertainty for the measurement of individual sites, etc.).

In a preferred embodiment, the SRM measurement model is implemented as a neural network model. In other examples, the SRM measurement model may be implemented as a linear model, a polynomial model, a response surface model, a decision tree model, a random forest model, a support vector machine model or other types of models.

In some examples, training data sets 171 and 172 are generated synthetically. For example, a process simulator such as the Positive Resist Optical Lithography (PROLITH) simulation software available from KLA-Tencor Corporation, Milpitas, California (USA) may be employed. In general, any process modeling technique or tool may be contemplated within the scope of this patent document (e.g., Coventor simulation software available from Coventor, Inc., Cary, North Carolina, USA). In these embodiments, the combined data set 175 is the combined synthetic diffraction patterns and the known values of one or more parameters of interest 179 are simply the critical dimensions used to synthesize the diffraction patterns.

In a further aspect, a trained signal response metrology model is employed to estimate values of structural parameters of interest having unknown values based on combined measurement signals.

Figure 4:
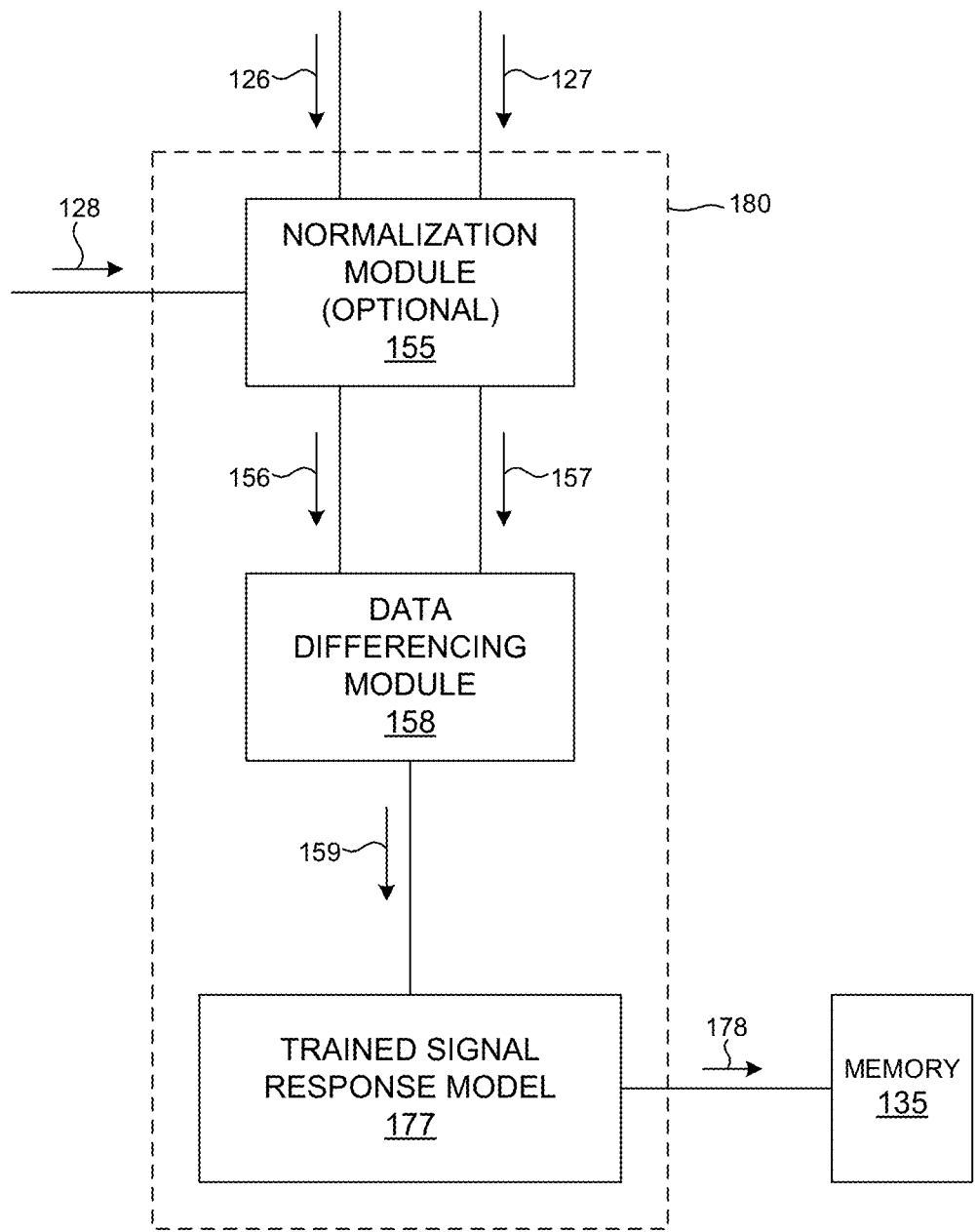
FIG. 4 is a diagram illustrative of a SRM model engine.

FIG. 4 depicts a diagram illustrative of a SRM model engine 180. As depicted in FIG. 4, x-ray scatterometry data 126 collected after a critical process step, and x-ray scatterometry data 127 collected before the critical process step are normalized by normalization module 155 as described hereinbefore. Normalized data sets 156 and 157 are communicated to data differencing module 158. Combined data set 159 is generated by data differencing module 158 from normalized data sets 156 and 157 as described hereinbefore. Combined data set 159 is communicated to trained SRM signal response model 177. SRM signal response model 177 generates estimated values of one or more parameters of interest 178. The estimated values 178 are stored in memory 135.

In another aspect, the estimation of one or more geometric parameters of interest of a complex semiconductor structure after a critical process step is based on actual x-ray scatterometry measurement data associated with the complex semiconductor structure after the critical process step and simulated x-ray scatterometry measurement data associated with the complex semiconductor structure before the critical process step.

Figure 5:
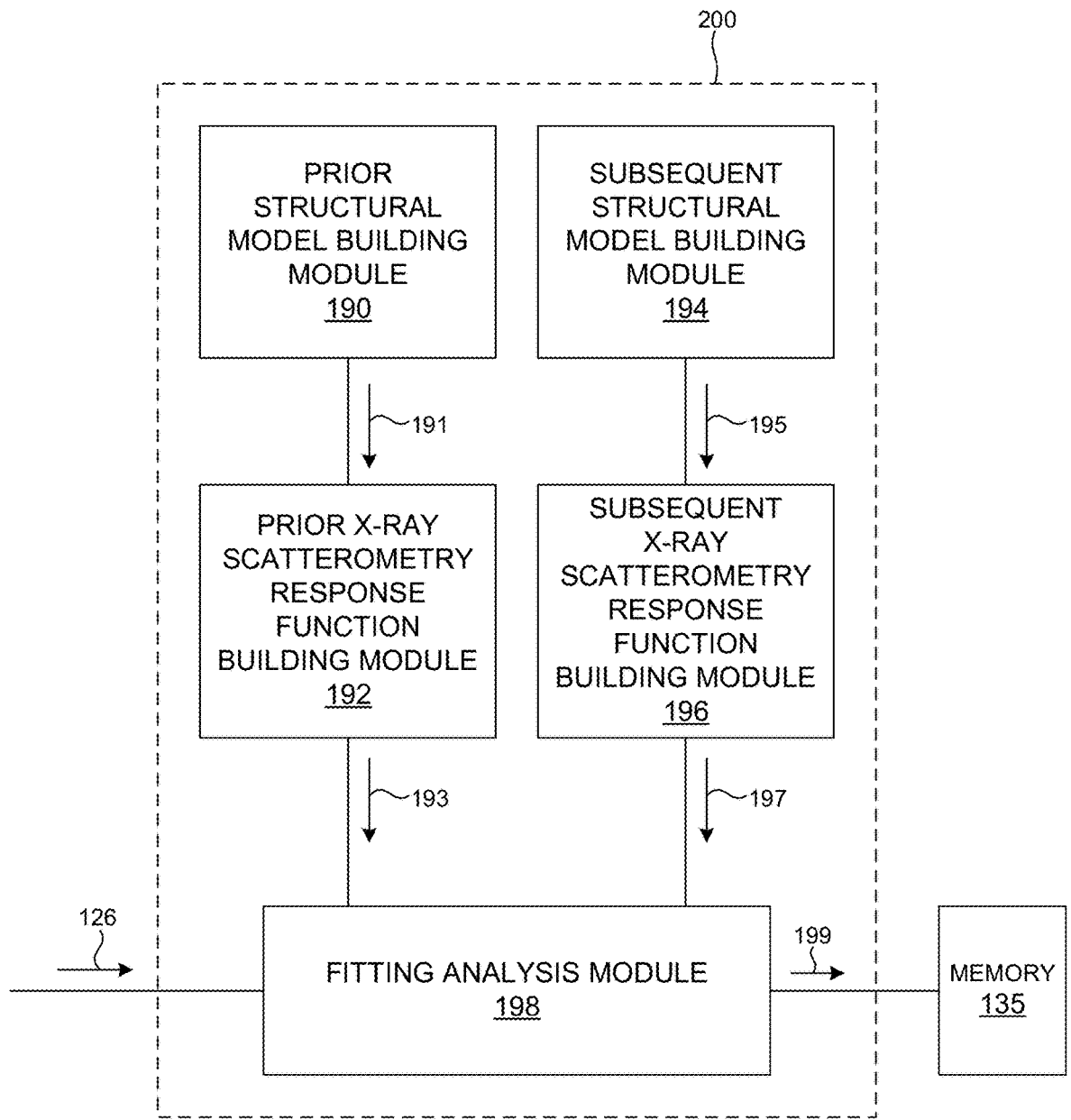
FIG. 5 is a diagram illustrative of another embodiment of a model building and analysis engine to estimate values of one or more geometric parameters characterizing a complex semiconductor structure based on x-ray scatterometry measurement data both before and after a critical process step.

FIG. 5 depicts an illustration of an embodiment of a model building and analysis engine 200 to estimate values of one or more geometric parameters characterizing a complex semiconductor structure based on x-ray scatterometry measurement data associated with the complex semiconductor structure both before and after a critical process step.

As depicted in FIG. 5, a prior structural model building module 190 generates a geometric model 191 of the measured structure before the critical process step. Geometric model 191 is communicated to prior x-ray scatterometry response function building module 192, which generates a prior measurement response model 193 based on the geometric model 191. The prior measurement response model 193 simulates the response of the measured structure to measurement by an x-ray scatterometry system (e.g., metrology system 100) before the critical process step. Prior measurement response model 193 is communicated to fitting analysis module 198.

Similarly, subsequent structural model building module 194 generates a geometric model 195 of the measured structure after the critical process step. Geometric model 194 is communicated to subsequent x-ray scatterometry response function building module 196, which generates a subsequent measurement response model 197 based on the geometric model 195. The subsequent measurement response model 197 simulates the response of the measured structure to measurement by an x-ray scatterometry system (e.g., metrology system 100) after the critical process step. Subsequent measurement response model 197 is communicated to fitting analysis module 198.

X-ray scatterometry data 126 is collected from a wafer by an x-ray scatterometry system such as metrology system 100 depicted in FIG. 1. X-ray scatterometry data 126 is collected after a critical process step is performed on wafer 101 and is communicated to fitting analysis module 198.

Fitting analysis module 198 performs a regression on the measured data set 126 using the subsequent measurement response model 197 and the prior measurement response model 193 to estimate values of one or more critical dimensions 199. The estimated values 199 are stored in memory 135. The geometric parameters of interest are floated. In some embodiments, additional parameters, such as the intensity of each independent order, are also floated to account for imperfect removal of feature(s) not affected by the critical process step. In some embodiments, an objective function of a least-squares regression performed by fitting analysis module 198 includes both an error term and a regularization term as illustrated by equation (2).

$$\Sigma_{pixels}((\text{SubsequentStruct}_{Sim}-\text{SubsequentStruct}_{Meas})^2 + (\lambda \cdot \text{PriorStruct}_{Sim})^2) \quad (2)$$

As illustrated in equation (2), the term SubsequentStruct$_{Sim}$ is the output of the subsequent measurement response model 197, and the term SubsequentStuct$_{Meas}$ is the measured data 126. The difference between these terms is the error term that drives the optimization. The term PriorStruct$_{sim}$ is the output of the prior measurement response model 193. The coefficient, $\lambda$, is a scalar valued regularization factor that effectively sets the weighting of the regularization term. In this optimization, the regularization term penalizes the intensity contributions of the prior structure. As a result, intensity contributions due to portions of the structure that are changed by the critical process step, i.e., the geometric parameters of interest, are emphasized.

In general, measurements associated with instances of a measured structure before a critical process step may be performed on one or more wafers. Similarly, measurements associated with instances of a measured structure after a critical process step may be performed on one or more wafers. In some embodiments, it is preferred to measure instances of a structure before a critical process step on one wafer (e.g., a "golden" wafer) and measurements associated with instances of the measured structure after the critical process step are performed on many different test wafers.

As described herein, the estimation of one or more geometric parameters of interest of a complex semiconductor structure after a critical process step is based on x-ray scatterometry measurement data associated with the complex semiconductor structure both before and after the critical process step. In general, the estimation of one or more geometric parameters of interest of a complex semiconductor structure after a critical process step may be based on x-ray scatterometry data associated with the complex semiconductor structure before any number of process steps, both critical and non-critical, and after the number of process steps.

For example, the measurement of tungsten recess may be based on measurement data collected before the word line cut, after the word line cut, or after replacing the nitride with tungsten, in addition to the measurement data collected after the recess etch.

In a further embodiment, system 100 includes one or more computing systems 130 employed to perform x-ray scatterometry measurements as described herein. The one or more computing systems 130 are communicatively coupled to the detector 116. In one aspect, the one or more computing systems 130 are configured to receive measurement data 126 associated with measurements of the structure of specimen 101. In another aspect, the one or more computing systems 130 are configured to receive measurement data associated with instances of the measured structure at any previous process steps.

It should be recognized that the various steps described throughout the present disclosure may be carried out by a single computer system 130 or, alternatively, a multiple computer system 130. Moreover, different subsystems of the system 100, such as the detector 116 or x-ray source 110, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the detector 116 in any manner known in the art. For example, the one or more computing systems 130 may be coupled to computing systems associated with the detector 116. In another example, the detector 116 may be controlled directly by a single computer system coupled to computer system 130.

The computer system 130 of the metrology system 100 may be configured to receive and/or acquire data or information from the subsystems of the system (e.g., detector 116 and the like) by a transmission medium that may include wireline and/or wireless portions. In this manner, the transmission medium may serve as a data link between the computer system 130 and other systems or subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, process tools, a reference measurement source, or other external systems). For example, the computing system 130 may be configured to receive measurement data from a storage medium (i.e., memory 132 or an external memory) via a data link. For instance, measurement results obtained using detector 116 may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or a structural parameter value determined by computer system 130 may be communicated and stored in an external memory (e.g., memory 135). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 19:
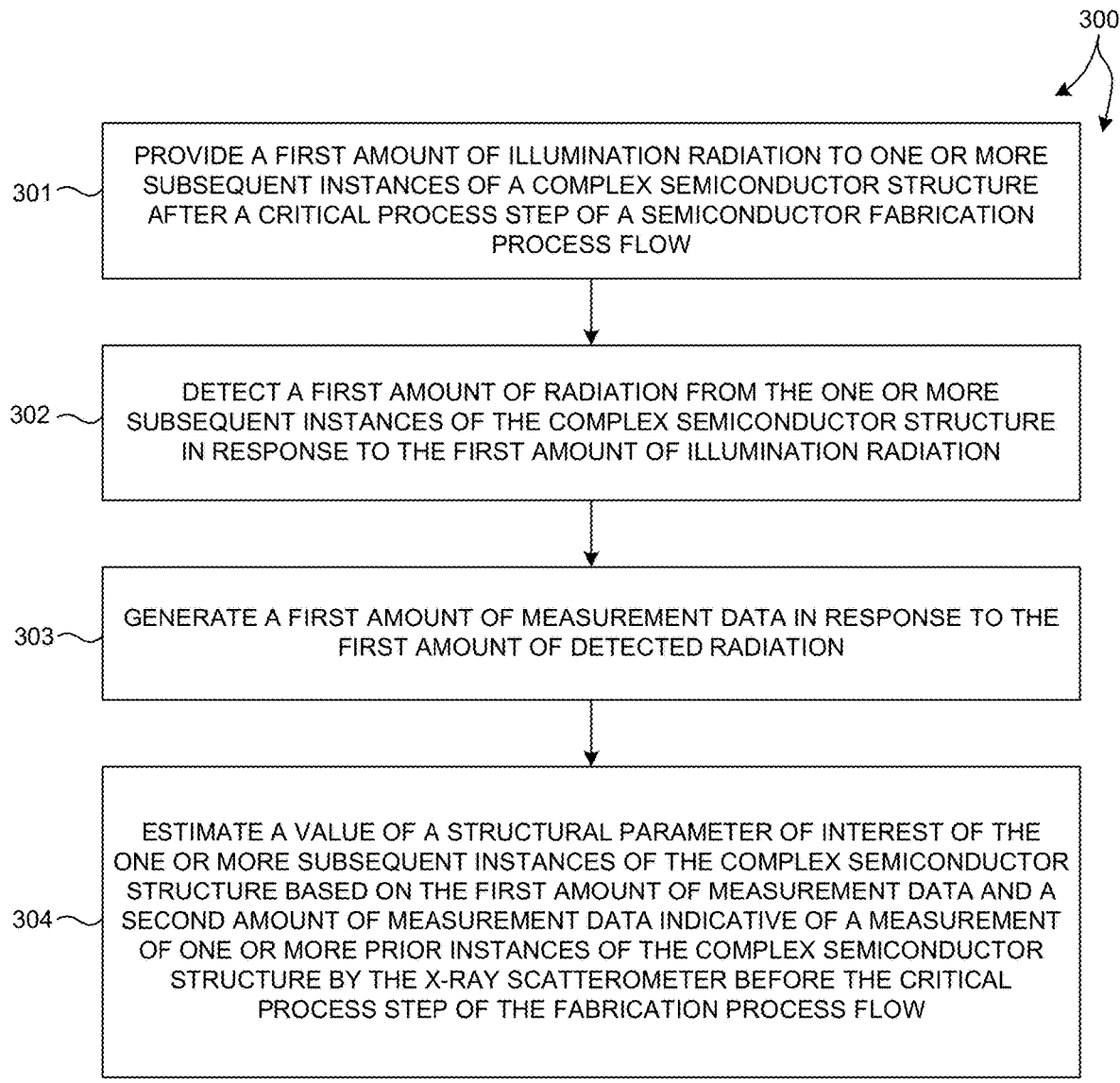
FIG. 19 illustrates a method suitable for implementation by a metrology system such as metrology system 100 illustrated in FIG. 1 of the present invention.

FIG. 19 illustrates a method 300 suitable for implementation by a metrology system such as metrology system 100 illustrated in FIG. 1 of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 301, a first amount of illumination radiation is provided to one or more subsequent instances of a complex semiconductor structure after a critical process step of a semiconductor fabrication process flow.

In block 302, a first amount of radiation from the one or more subsequent instances of the complex semiconductor structure in response to the first amount of illumination radiation is detected.

In block 303, a first amount of measurement data is generated in response to the first amount of detected radiation.

In block 304, a value of a structural parameter of interest of the one or more subsequent instances of the complex semiconductor structure is estimated based on the first amount of measurement data and a second amount of measurement data indicative of a measurement of one or more prior instances of the complex semiconductor structure by the x-ray scatterometer before the critical process step of the fabrication process flow.

In general, any scatterometry measurement technique, or combination of two or more scatterometry measurement techniques may be contemplated within the scope of this patent document. Exemplary measurement techniques include, but are not limited to spectroscopic ellipsometry, including Mueller matrix ellipsometry, spectroscopic reflectometry, spectroscopic scatterometry, scatterometry overlay, beam profile reflectometry, both angle-resolved and polarization-resolved, beam profile ellipsometry, single or multiple discrete wavelength ellipsometry, transmission small angle x-ray scatterometer (TSAXS), small angle x-ray scattering (SAXS), grazing incidence small angle x-ray scattering (GISAXS), wide angle x-ray scattering (WAXS), x-ray reflectivity (XRR), x-ray diffraction (XRD), grazing incidence x-ray diffraction (GIXRD), high resolution x-ray diffraction (HRXRD), x-ray photoelectron spectroscopy (XPS), x-ray fluorescence (XRF), grazing incidence x-ray fluorescence (GIXRF), low-energy electron induced x-ray emission scatterometry (LEXES), x-ray tomography, and x-ray ellipsometry. In general, any metrology technique applicable to the characterization of semiconductor structures, including image based metrology techniques, may be contemplated. Additional sensor options include electrical sensors such as non-contact capacitance/voltage or current/voltage sensors which bias the device and detect the resulting bias with an optical sensor (or the converse), or assisted optical techniques, such as XRD, XRF, XPS, LEXES, SAXS, and pump probe techniques. In one embodiment a two-dimensional beam profile reflectometer (pupil imager) may be used to collect both angle resolved and/or multi-spectral data in a small spot size. A UV Linnik interferometer may also be used as a Mueller matrix spectral pupil imager.

In some examples, the model building, training, and measurement methods described herein are implemented as an element of a SpectraShape® optical critical-dimension metrology system available from KLA-Tencor Corporation, Milpitas, California, USA. In this manner, the model is created and ready for use immediately after the DOE wafer spectra are collected by the system.

In some other examples, the model building and training methods described herein are implemented off-line, for example, by a computing system implementing AcuShape® software available from KLA-Tencor Corporation, Milpitas, California, USA. The resulting, trained model may be incorporated as an element of an AcuShape® library that is accessible by a metrology system performing measurements.

In general, the methods and systems for performing semiconductor metrology presented herein may be applied directly to actual device structures or to dedicated metrology targets (e.g., proxy structures) located in-die or within scribe lines.

In yet another aspect, the measurement techniques described herein can be used to provide active feedback to a process tool (e.g., lithography tool, etch tool, deposition tool, etc.). For example, values of the structural parameters determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

In general, the systems and methods described herein can be implemented as part of a dedicated metrology tool, or alternatively implemented as part of a process tool (e.g., lithography tool, etch tool, etc.).

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, a metrology system may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
an x-ray scatterometer comprising:
an illumination source that provides a first amount of illumination radiation to one or more subsequent instances of a complex semiconductor structure after a critical process step of a semiconductor fabrication process flow; and
a detector that detects a first amount of radiation from the one or more subsequent instances of the complex semiconductor structure in response to the first amount of illumination radiation and generates a first amount of measurement data in response to the first amount of detected radiation; and
a computing system configured to estimate a value of a structural parameter of interest of the one or more subsequent instances of the complex semiconductor structure based on the first amount of measurement data and a second amount of measurement data indicative of a measurement of one or more prior instances of the complex semiconductor structure by the x-ray scatterometer before the critical process step of the fabrication process flow.

2. The metrology system of claim 1, the computing system further configured to:
combine the first amount of measurement data with the second amount of measurement data to generate an amount of combined measurement data, wherein the estimating of the value of the structural parameter of interest is based on the amount of combined measurement data.

3. The metrology system of claim 1, the computing system further configured to:
generate a geometrically parameterized measurement response model including one or more geometric features affected by the critical process step and not including one or more geometric features not affected by the critical process step, wherein the estimating of the structural parameter of interest involves minimizing an objective function that includes a difference between the combined measurement data set and a simulated data set resulting from the geometrically parameterized measurement model.

4. The metrology system of claim 2, the illumination source computing system further configured to:
provide a second amount of illumination radiation to one or more subsequent instances of the complex semiconductor structure having known values of the structural parameter of interest after the critical process step of the semiconductor fabrication process flow,
the detector further configured to:
detect a second amount of radiation from the one or more subsequent instances of the complex semiconductor structure in response to the second amount of illumination radiation and generate a Design Of Experiments (DOE) measurement data set in response to the second amount of detected radiation, and
the computing system further configured to:
combine the DOE measurement data set with a second amount of DOE measurement data to generate an amount of combined DOE measurement data, the second amount of DOE measurement data indicative of a measurement of one or more prior instances of the complex semiconductor structure having known values of the structural parameter of interest by the x-ray scatterometer before the critical process step of the fabrication process flow, and
train a signal response metrology model based on the amount of combined DOE measurement data and the known values of the structural parameter of interest.

5. The metrology system of claim 4, wherein the amount of combined measurement data is provided as input to the trained signal response metrology model, and wherein an output of the trained signal response metrology model corresponding to the amount of combined measurement data provided as input is the value of the structural parameter of interest.

6. The metrology system of claim 2, the computing system further configured to:
normalize the first and second amounts of measurement data based on values of one or more system parameters associated with measurement of the first and second amounts of measurement data, respectively.

7. The metrology system of claim 6, wherein the combining of the first amount of measurement data with the second amount of measurement data to generate the amount of combined measurement data involves determining a difference between the first amount of measurement data and the second amount of measurement data on a pixel by pixel basis.

8. The metrology system of claim 1, wherein the second amount of measurement data is generated by a measurement of the one or more prior instances of the complex semiconductor structure by the x-ray scatterometer before the critical process step of the fabrication process flow.

9. The metrology system of claim 1, wherein the second amount of measurement data is generated by deleting a region of interest from the first amount of measurement data and replacing the deleted region of interest with signals generated by a patch matching algorithm.

10. The metrology system of claim 1, wherein the one or more subsequent instances of the complex semiconductor structure are disposed on one or more wafers.

11. The metrology system of claim 10, wherein the one or more prior instances of the complex semiconductor structure are disposed on one or more wafers different from the one or more subsequent instances of the complex semiconductor structure.

12. The metrology system of claim 10, wherein the one or more prior instances of the complex semiconductor structure are disposed on the same one or more wafers upon which the one or more subsequent instances of the complex semiconductor structure are disposed.

13. The metrology system of claim 1, wherein the illumination source provides the first amount of illumination radiation at a plurality of different orientations with respect to the complex semiconductor structure.

14. The metrology system of claim 1, wherein the critical process step is any of a lithographic process step, a deposition process step, and an etch process step.

15. The metrology system of claim 1, wherein the structural parameter of interest is any of a film thickness after a deposition process step and a material recess depth after an etch process step.

16. The metrology system of claim 1, wherein the estimating of the value of the structural parameter of interest involves minimizing an objective function that includes a difference term and a regularization term, the difference term including a difference between the first amount of measurement data and a first amount of simulated measurement data that simulates the measurement of the one or more subsequent instances of the complex semiconductor structure after the critical process step by the x-ray scatterometer, and the regularization term including a second amount of simulated measurement data that simulates the measurement of the one or more prior instances of the complex semiconductor structure before the critical process step by the x-ray scatterometer.

17. A metrology system comprising:
an x-ray scatterometer comprising:
an illumination source that provides a first amount of illumination radiation to one or more subsequent instances of a complex semiconductor structure after a critical process step of a semiconductor fabrication process flow; and
a detector that detects a first amount of radiation from the one or more subsequent instances of the complex semiconductor structure in response to the first amount of illumination radiation and generates a first amount of measurement data in response to the first amount of detected radiation; and
a non-transitory, computer-readable medium, comprising:
code for causing a computing system to estimate a value of a structural parameter of interest of the one or more subsequent instances of the complex semiconductor structure based on the first amount of measurement data and a second amount of measurement data indicative of a measurement of one or more prior instances of the complex semiconductor structure by the x-ray scatterometer before the critical process step of the fabrication process flow.

* * * * *